United States Patent [19]

Buehler et al.

[11] Patent Number: 4,918,377

[45] Date of Patent: Apr. 17, 1990

[54] INTEGRATED CIRCUIT RELIABILITY TESTING

[75] Inventors: Martin G. Buehler, La Canada; Hoshyar R. Sayah, Los Angeles, both of Calif.

[73] Assignee: The United States of America as represented by the Administrator of the National Aeronautics and Space Administration, Washington, D.C.

[21] Appl. No.: 279,676

[22] Filed: Dec. 5, 1988

[51] Int. Cl.$^4$ .................... G01R 31/00; G01R 27/02; G01R 27/14

[52] U.S. Cl. ................... 324/691; 324/158 R; 324/716; 437/8

[58] Field of Search ............ 324/73 PC, 158 R, 62 R, 324/64, 73 R, 65 R; 437/8; 430/30

[56] References Cited

U.S. PATENT DOCUMENTS

| | | | |
|---|---|---|---|
| 3,781,670 | 12/1973 | McMahon, Jr. | |
| 3,974,443 | 8/1976 | Thomas | 324/158 R |
| 3,983,479 | 9/1976 | Lee et al. | 324/158 R |
| 4,144,493 | 3/1979 | Lee et al. | 324/158 R |
| 4,336,495 | 6/1982 | Hapke | 324/158 T |
| 4,347,479 | 8/1982 | Cullet | 324/65 R |
| 4,386,459 | 6/1983 | Boulin | 324/158 R |
| 4,399,205 | 8/1983 | Bergendahl | 324/158 R |
| 4,516,071 | 5/1985 | Buehler | 324/158 R |
| 4,672,314 | 6/1987 | Kokkas | 324/158 R |
| 4,725,773 | 2/1988 | Lieneweg | 324/73 R |
| 4,835,466 | 5/1989 | Maly et al. | 324/158 R |

Primary Examiner—Reinhard J. Eisenzopf
Assistant Examiner—Vinh P. Nguyen
Attorney, Agent, or Firm—Thomas H. Jones; John R. Manning; Charles E. B. Glenn

[57] ABSTRACT

A technique is described for use in determining the reliability of microscopic conductors deposited on an uneven surface of an integrated circuit device. A wafer containing integrated circuit chips is formed with a test area having regions of different heights. At the time the conductors are formed on the chip areas of the wafer, an elongated serpentine assay conductor is deposited on the test area so the assay conductor extends over multiple steps between regions of different heights. Also, a first test conductor is deposited in the test area upon a uniform region of first height, and a second test conductor is deposited in the test area upon a uniform region of second height. The occurrence of high resistances at the steps between regions of different height is indicated by deriving the "measured length" of the serpentine conductor using the resistance measured between the ends of the serpentine conductor, and comparing that to the design length of the serpentine conductor. The percentage by which the measured length exceeds the design length, at which the integrated circuit will be discarded, depends on the required reliability of the integrated circuit.

7 Claims, 2 Drawing Sheets

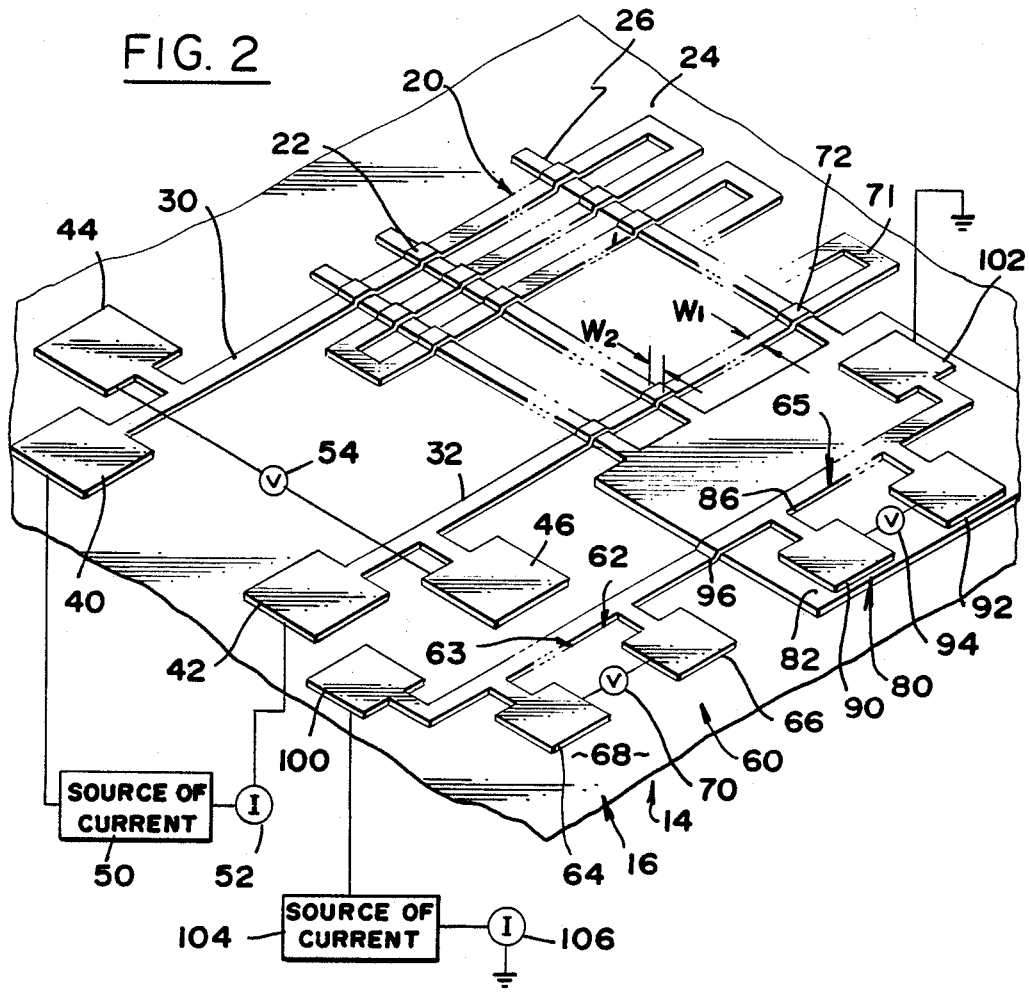
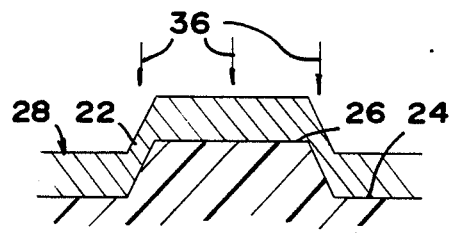
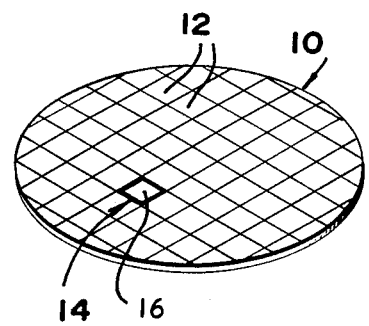
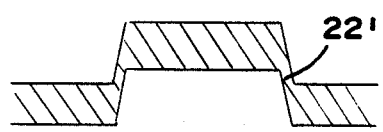

INTEGRATED CIRCUIT RELIABILITY TESTING

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

This invention relates to techniques for testing the reliability of integrated circuits.

BACKGROUND ART

The reliability of microscopic conductors deposited on integrated circuits formed on a wafer, can be evaluated by forming a long serpentine resistance structure or assay conductor on the same wafer and measuring the resistance between the ends of the serpentine assay conductor. The resistance between the ends of the serpentine conductor determines the "measured length" of the serpentine conductor. This measured length is then compared to the design length of the serpentine conductor which is known from the design layout of the serpentine conductor, to determine discrepancies that may indicate defects in the serpentine conductor. A similar method is to compare the resistance between the ends of the serpentine conductor and the level of resistance that would be expected in the absence of defects, of an ideal serpentine conductor. Both methods are equivalent and can be used interchangeably.

In some integrated circuits, the microscopic conductors of the circuit pass along steps connecting regions of different heights. There is a considerable possibility of defects in a conductor along the steps where the conductor extends between the regions of different heights. Also, the conductor may have different widths at the different heights, due to masks through which light is passed to define the conductors, being out of focus. A higher than expected resistance for a serpentine assay conductor extending along the multiple steps, could be due to the conductor having a smaller than expected width, which does not indicate unreliability. A testing method and apparatus which enabled assessment of the causes of a discrepancy between the ideal and the measured resistance of the serpentine assay conductor, would be of considerable value.

STATEMENT OF THE INVENTION

In accordance with one embodiment of the present invention, a method and apparatus are provided for indicating the reliability of microscopic conductors on integrated circuits that pass across regions of different heights. The apparatus includes an elongated assay conductor on the integrated circuit device, which extends along multiple steps between regions of first and second heights. The apparatus also includes a test structure with an elongated test conductor on the integrated circuit device, which extends along a region of uniform height. A measurement is taken of the resistance of the assay conductor. A measurement is also taken of the resistance of the test conductor, which indicates the resistance per unit length that should be expected from the assay conductor. The test conductor is formed at the same time as the assay conductor, so they have the same width and thickness. The test structure may include two test conductors, each extending along a region of different uniform height (so there are no steps along a test conductor), to account for possible differences in resistance per unit length of the regions of different heights.

The novel features of the invention are set forth with particularity in the appended claims. The invention will be best understood from the following description when read in conjunction with the accompanying drawings.

BRIEF DESCRIPTION OF THE DRAWINGS

FIG. 1 is a perspective view of an integrated circuit device with which the present invention is useful.

FIG. 2 is a perspective view of the test area of the device of FIG. 1.

FIG. 4 is a sectional view of a portion of the circuit of FIG. 3.

FIG. 5 is a view of circuit similar to that of FIG. 4, but showing a higher degree of thinning.

DETAILED DESCRIPTION OF THE INVENTION

Figure 3:
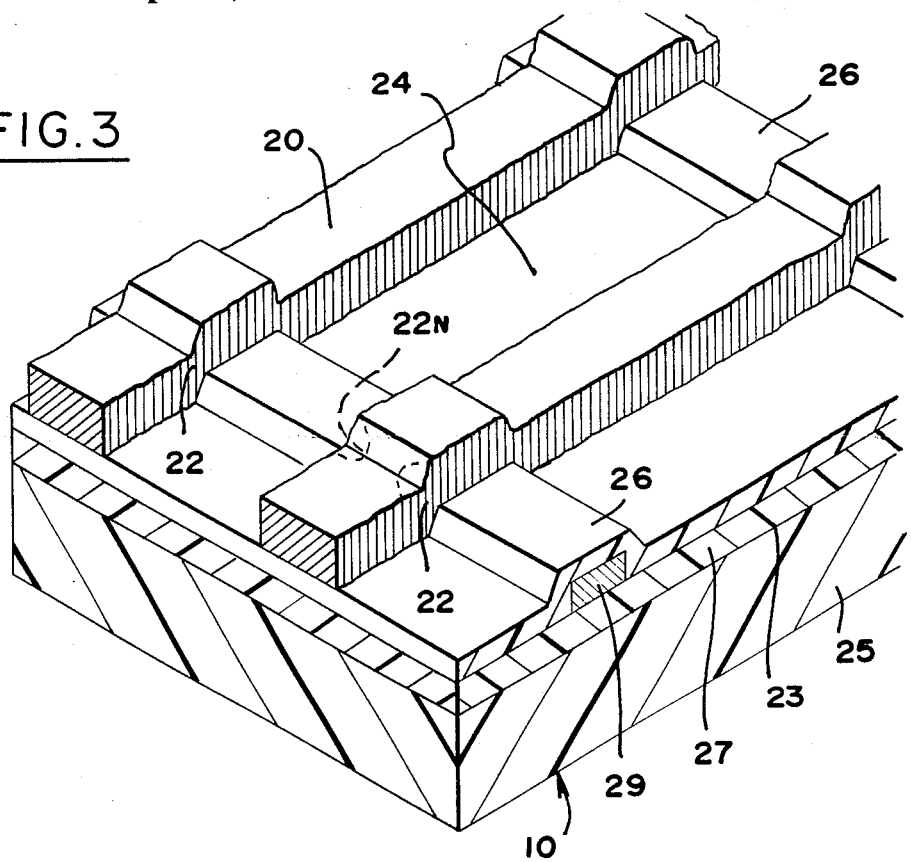
FIG. 3 is an enlarged perspective and sectional view of a portion of the test area of FIG. 2.

FIG. 1 illustrates an integrated circuit device 10 which includes a silicon wafer on which numerous integrated circuits 12 have been formed. The device also includes a test area 14 where a test apparatus is formed that is useful in testing the reliability of portions of the integrated circuits. FIG. 2 illustrates the test area 14, showing a test apparatus 16 that is useful in testing the reliability of microscopic conductors that must pass over steps extending between areas of different height. The apparatus includes an assay conductor 20 that extends over multiple steps 22 between regions such as 24 and 26 of different heights. The assay conductor 20 extends in a serpentine configuration, to provide a long length of conductor in a limited area. In one example, the width $W_1$ of the conductor along most of its length is about 5 microns, and the assay conductor has a total length between its opposite end portions 30, 32 of 10 cm. Similar conductors extending over surface areas of different height occur in the circuits of the integrated circuit device. As shown in FIG. 3, the regions 26 of greater height, relative to the surfaces 23 of an insulative base 25 and of an insulative layer 27 thereon, lie over embedded cross-conductors 29.

As indicated in FIG. 4, an actual integrated circuit conductor 28, like the assay conductor 20, is formed by depositing it on the uneven surface 34 of the integrated circuit device, arrows 36 indicating the direction of material motion during its deposition. After deposition, typical prior art methods are used, such as depositing a photoresist, exposing the photoresist through a mask washing away only the exposed or unexposed areas, and etching away the areas unprotected by photoresist. Thinning can occur at the steps 22. FIG. 5 illustrates a situation where the transition between the different heights is steep and thinning is more pronounced at steps 22'. In addition, "necking" can occur, where the width of the conductor along the step is narrow as indicated at 22 N in FIG. 3. The reduced cross sectional area along the steps introduces higher conductor resistance and is a major source of defects in such integrated circuits.

Another mechanism that introduces higher assay conductor resistance compared to the ideal conductor is that the assay conductor length increases due to undulations of the assay conductor in going over steps. However, this length increase is considered negligible compared to the total length of the assay conductor.

By measuring the resistance along the long serpentine assay conductor 20 (FIG. 2), the "measured length" of the serpentine assay conductor is calculated. Such calculation can be made by knowledge as to how the serpentine assay conductor was formed and the resistance per unit length of the assay conductor over the regions of first and second heights. The resistance per unit length of the assay conductor over the regions of first and second heights are derived from the test conductor resistance measurements. The measured length of the assay conductor includes the effects of the steps and the step transitions, and of necking and thinning, each of which introduce higher assay conductor resistance measurements when present. The design length of the assay conductor is derived from the design layout of the assay conductor (which assumes no defects). By comparing the assay conductor "measured length" to its design length, it is possible to obtain an indication of the reliability of an assay conductor extending over steps. In one example, if the measured length of the assay conductor exceeds 150% of the design length of the assay conductor, then this indicates excessive resistance along the steps. The percentage by which the measured length exceeds the design length, at which the integrated circuit device will be discarded, depends on the required reliability of the integrated circuit.

Equations 1 through 4 written below, show how one calculates the measured serpentine length (for an assay conductor), the measured serpentine resistance, the difference between actual and design serpentine lengths for low or high regions, and the design serpentine length.

$$L_{serp.meas} = \frac{(R_{serp.meas} * L_{serp.design})}{(R'_{low} * L_{low.design} + R'_{high} * L_{high.design})} \quad \text{Eq. 1}$$

$$R_{serp.meas} = R'_{low} * L_{low.design} + R'_{high} * L_{high.design} + 2L_o(R'_{low} - R'_{high}) + 2R_{step} \quad \text{Eq. 2}$$

$$2L_o = L_{high.design} - L_{high} = L_{low} - L_{low.design} \quad \text{Eq. 3}$$

$$L_{serp.design} = L_{low.design} + L_{high.design} = L_{low} + L_{high} \quad \text{Eq. 4}$$

Figure 6:
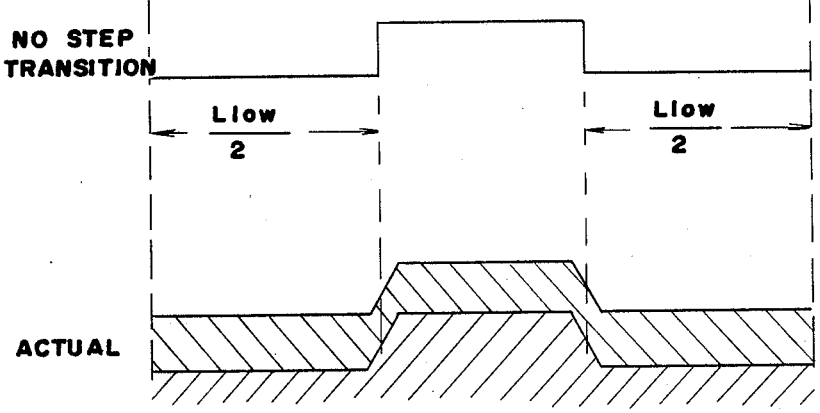
FIG. 6 is a view similar to that of FIG. 4, for a theoretical assay conductor which has a single high region and a single low region, and showing the difference between design and actual assay conductor lengths.

$L_{serp.meas}$ = measured serpentine length $L_{serp.design}$ = design serpentine length $R_{serp.meas}$ = measured serpentine resistance $R'_{low}$ = resistance per unit length over the low region $R'_{high}$ = resistance per unit length over the high region $R_{step}$ = step resistance due to necking, thinning and undulation $L_{low.design}$ = design serpentine length over the low region $L_{high.design}$ = design serpentine length over the high region $L_{low}$ = actual serpentine length over the low region $L_{high}$ = actual serpentine length over the high region $2L_o$ = difference between actual and design serpentine length over low or high regions FIG. 6 shows the quantities above for a theoretical conductor having a single high region and a single low region.

As shown in FIG. 2, the assay conductor 20 is formed with assay conductor pads at its opposite end portions 30, 32. These pads include a current pad 40, 42, and a voltage pad 44, 46 at each end portion of the assay conductor. A source of current 50 is connected through a current meter 52 between the two current pads 40, 42 to pass a measured current along the length of the assay conductor. A voltmeter 54 is connected between the opposite voltage pads 44, 46 to measure the voltage between the end portions of the assay conductor. Of course, the measurements of voltage and current enable a determination of the resistance along the length of the assay conductor.

Where a relatively small percentage change in measured length, such as from 140% to 160% of designed length, is enough to change from an acceptable to an unacceptable level, it is important to determine the measured length of the assay conductor with accuracy. The factors that affect accuracy of determination of the measured length, are the actual width, the actual thickness, and the proportions of raised and lowered areas of the assay conductor.

The assay conductor and the conductors of the integrated circuits are formed by techniques that require a mask to define the placement and width of the conductors. If the mask is not formed or positioned precisely, the width of the conductors will vary from the intended width. Thus, the width $W_1$ along the low region may turn out to be 4 microns or 6 microns instead of the intended 5 microns.

Applicant determines the resistance per unit length of the assay conductor over the first and second height regions by forming two test structures 60, 80 (FIG. 2) which includes a test structure conductor 62 with two portions 63, 65. The test structures 60, 80 are formed at the same time as the assay conductor 20, using the same equipment and setup, and with the equipment designed to make the test conductor and assay conductor of the same width, when over a region of the same height. The test conductor portion 63 is formed on an area 68 of uniform height which is the same as region 24. The test conductor portion 65 is formed on an area 82 of uniform height which is the same as region 26. The test structure 60 includes a pair of voltage pads 64, 66, and the test structure 80 includes a pair of voltage pads 90, 92. A measured current is passed along the length of the test conductor 62 and the voltage drop along its length is measured as by a voltmeter 70, 94 connected between the voltage pads. The precise distance between the locations where the voltage pads contact the test conductor 62 is known, and the voltage and current measurements enable a determination of the resistance per unit length of the test conductor over the regions of raised and lowered heights.

The assay conductor includes multiple lower portions such as 71 of a lower height and multiple raised portions 72 of an elevated height, as well as multiple step regions connecting them. It is possible for the widths $W_1$ and $W_2$ of the lower and raised portions 71, 72 to differ. This may be due to a mask being in focus at one level but out of focus at another level.

As seen in equation 1, the assay conductor measured length Lserp.meas depends on the proportion of the assay conductor over the lower and raised areas. Due to processing events, for example over/under-etching of layers, the actual proportion of the assay conductor over the lower and raised areas is not easily known. FIG. 6 shows how the design and actual steps can differ. Applicant uses the design proportions of the assay conductor as a good estimate of the actual proportions of the assay conductor when determining the measured length of the assay conductor. Where the resistance per unit length of the assay conductor over the raised and lowered regions differ and the design proportions of the assay conductor do not provide a good estimate of the actual proportion of the assay conductor over the regions of different heights, the measured length of the assay conductor can be shorter or longer than the design length (assuming no thinning and necking at the steps). An optical measurement technique, such as SEM, may be used to determine the proportions of the assay conductor lying over the raised and lowered areas to eliminate the assay conductor length increase/decrease due to over/under-etching of layers during the fabrication process. Where the step transition is gradual and thinning and necking do not occur, so that Rstep=0, the difference between the actual and design serpentine assay conductor length over low or high regions, 2Lo, is determined from equation 2.

Thus, the invention provides a method and apparatus for indicating the reliability of circuit conductors which have been formed on an uneven surface of an integrated circuit device. An elongated assay conductor extends along multiple steps between regions of first and second different heights on the integrated circuit device and instruments are used to measure the resistance between the opposite ends of the assay conductor. A test structure is also provided, which includes an elongated test conductor which extends along a region of substantially constant height on the integrated circuit. The equipment is also used to measure the resistance of the test conductor, to thereby determine the resistance per unit length of the assay conductor. The apparatus preferably includes two test structures, each with a test conductor at a different one of the two heights along which the assay conductor extends, to take account of the fact that the resistance per unit length can vary with the height of the surface on which a conductor is formed. The test conductors of the two test structures can be connected in series, with each having a current pad, so current can flow through the two test conductors in series, to simplify testing and reduce the size of the test structure.

Although particular embodiments of the invention have been described and illustrated herein, it is recognized that modifications and variations may readily occur to those skilled in the art and consequently it is intended to cover such modifications and equivalents.

We claim:

1. Apparatus for use in determining the reliability of circuit conductors on an uneven surface of an integrated circuit device, wherein the surface has regions at first and second different heights and said circuit conductors have portions extending in steps between said regions of different heights, comprising:

an elongated assay conductor on said integrated circuit device which extends along multiple steps between regions at said first and second heights, said elongated conductor having opposite ends and assay conductor pads at said ends;

a test structure which includes a first elongated test conductor on said integrated circuit device which extends along a region of substantially constant height, said test conductor having the same width as portions of said assay conductor that lie at one of said heights, said conductor having opposite end portions and test structure pads at said test conductor end portions;

means connectable to said assay conductor pads for measuring the resistance along the length of said assay conductor, and connectable to said test structure pads for determining the resistance of said test structure conductor, whereby to obtain an indication of the reliability of said assay conductor.

2. The apparatus described in claim 1 wherein:
said test structure includes a second elongated test conductor on said integrated circuit device which extends along another region of substantially constant height, said first mentioned and second test conductors extending along regions of said first and second heights.

3. The apparatus described in claim 1 wherein:
said test structure includes a second test conductor having opposite end portions, said first mentioned test conductor and second test conductor respectively extending along first and second regions of said first and second heights, said end portions of said first and second test conductors each including a first end portion joined to the first end portion of the other test conductor;
said test structure pads including a pair of current pads each joined to second of said end portions of said test conductors, and two pairs of voltage pads each pair having a pad joined to an opposite end portion of one of said test conductors;
said means for measuring and determining including means for applying a current to flow between said pair of current pads and means for measuring the voltage between each of said pairs of voltage pads.

4. Apparatus for use in determining the reliability of circuit conductors on an uneven surface of an integrated circuit device wherein the surface has regions at first and second different heights and said circuit conductors have portions extending in steps between said regions of different heights, comprising:

an elongated assay conductor on said integrated circuit device, said assay conductor extending along multiple steps between regions at said first and second heights, said elongated conductor having opposite ends and having assay conductor pads at said ends;

a test structure assembly which includes first and second elongated test conductors each extending along a region of substantially uniform height, with said first and second test conductors lying at regions of said first and second heights, and with said first and second conductors having the same widths as portions of said assay conductor that lie respectively at said regions of first and second heights;

means for measuring the resistance along the length of said assay conductor, and along the length of each of said test conductors.

5. A method for judging the reliability of circuit conductors which have been formed on an uneven surface of an integrated circuit device wherein the surface has regions at first and second different heights and said circuit conductors have portions extending in steps between said regions of different heights, comprising:

forming an assay surface area on said integrated circuit device which has multiple regions at said first and second heights;

forming an elongated assay conductor on said assay surface area so the assay conductor extends in multiple steps over said regions of first and second heights thereon;

measuring the resistance along a known length of said assay conductor;

forming a first test conductor on a region of said assay surface area which is of substantially uniform height, at substantially the same time as said step of forming an elongated assay conductor; and measuring the resistance along a known length of said test conductor, whereby to enable a determination of the effect of said multiple steps on the resistance of said assay conductor.

6. The method described in claim 5 wherein:

said step of forming a test conductor includes forming a second test conductor on a region of said assay surface area which is of substantially uniform height at substantially the same time as said first mentioned test conductor is formed, with the heights of said first and second test conductors at said first and second heights, and measuring the resistance along a known length of said second test conductor.

7. The method described in claim 5 wherein:

said step of forming a test conductor includes forming first and second test structures, including forming said first mentioned test conductor at said first height, forming a second test conductor at a substantially uniform height equal to said second height, with each test conductor having first and second opposite end portions, forming a connecting conductor that connects said first end portions of said first and second test conductors, forming a current pad at each of said second end portions of said test conductors, and forming a voltage pad at each end portion of each test conductor;

said step of measuring includes passing a current in series through said current pads and said test conductors, and measuring the voltage between the voltage pads at the opposite ends of each each test conductor.

* * * * *